United States Patent
Lee

(10) Patent No.: US 12,482,784 B2
(45) Date of Patent: Nov. 25, 2025

(54) METHOD FOR CONTROLLING BOAT/STRIP TYPE SOLDER BALL PLACEMENT SYSTEM

(71) Applicant: S.S.P. INC., Incheon (KR)

(72) Inventor: Kyouho Lee, Suwon-si (KR)

(73) Assignee: S.S.P. INC., Incheon (KR)

( * ) Notice: Subject to any disclaimer, the term of this patent is extended or adjusted under 35 U.S.C. 154(b) by 530 days.

(21) Appl. No.: 17/905,274

(22) PCT Filed: Feb. 16, 2021

(86) PCT No.: PCT/KR2021/001937
§ 371 (c)(1),
(2) Date: Oct. 4, 2022

(87) PCT Pub. No.: WO2021/256656
PCT Pub. Date: Dec. 23, 2021

(65) Prior Publication Data
US 2023/0086461 A1 Mar. 23, 2023

(30) Foreign Application Priority Data

Jun. 16, 2020 (KR) .................. 10-2020-0072843

(51) Int. Cl.
*H01L 23/00* (2006.01)
*B23K 3/06* (2006.01)
(Continued)

(52) U.S. Cl.
CPC ............ *H01L 24/75* (2013.01); *B23K 3/0623* (2013.01); *G05B 19/19* (2013.01);
(Continued)

(58) Field of Classification Search
CPC ... H01L 24/75; B23K 3/0623; B23K 2101/40; G05B 19/19; G05B 2219/45029
See application file for complete search history.

(56) References Cited

FOREIGN PATENT DOCUMENTS

| KR | 10-0531230 B1 | 11/2005 |
|---|---|---|
| KR | 10-2007-0050007 A | 5/2007 |

(Continued)

*Primary Examiner* — Mohammad M Choudhry
(74) *Attorney, Agent, or Firm* — Bridgeway IP Law Group, PLLC; Jihun Kim

(57) ABSTRACT

Proposed is a method for controlling a boat carrier/substrate strip type solder ball placement system that allows solder ball mounting processes for a boat carrier type of a material and a substrate strip type of a material to be all performed in one system. In specific, the method allows the components or operation setting of the system to be automatically controlled according to the types of materials loaded on a magazine, thereby performing solder ball mounting processes for the two types of materials with high speed and high accuracy. In more specific, the method allows a component applied only to the solder ball mounting process for the boat carrier type of material and a component applied to the solder ball mounting process for the substrate strip type of material to be integrated with each other as a single component in the process of mounting the solder balls on the material on-loaded, thereby making it possible to perform the solder ball mounting processes for the two different types of materials in one system.

3 Claims, 8 Drawing Sheets

(51) Int. Cl.
  *G05B 19/19*  (2006.01)
  *B23K 101/40*  (2006.01)
(52) U.S. Cl.
  CPC .............................. *B23K 2101/40* (2018.08);
          *G05B 2219/45029* (2013.01); *H01L*
                  *2224/75621* (2013.01)

(56) References Cited

FOREIGN PATENT DOCUMENTS

| KR | 20070050007 | * | 5/2007 |
| KR | 10-0998255 B1 | | 12/2010 |
| KR | 10-2011-0034768 A | | 4/2011 |
| KR | 10-2011-0034769 A | | 4/2011 |
| KR | 10-1364043 B1 | | 2/2014 |
| KR | 10-1738511 B1 | | 5/2017 |
| KR | 10-2206226 B1 | | 1/2021 |

* cited by examiner

METHOD FOR CONTROLLING BOAT/STRIP TYPE SOLDER BALL PLACEMENT SYSTEM

TECHNICAL FIELD

The present invention relates to a method for controlling a boat carrier/substrate strip type solder ball placement system, and more specifically, to a method for controlling a boat carrier/substrate strip type solder ball placement system that is capable of allowing solder ball mounting processes for a boat carrier type of a material and a substrate strip type of a material to be all performed in one system.

In specific, the present invention relates to a method for controlling a boat carrier/substrate strip type solder ball placement system that is capable of allowing components or operation setting of the system to be automatically controlled according to types of materials loaded on a magazine, thereby performing solder ball mounting processes for the two types of materials with high speed and high accuracy.

BACKGROUND ART

Semiconductor technologies have been developed to improve the miniaturization and integration of devices, and as information technology (IT) devices become smaller, recently, low-power and high-performance chips capable of processing large capacity data have been introduced.

A flip chip as one of semiconductor chip packages made through such development in the semiconductor technologies is produced by directly attaching solder balls as bump balls made of solder to a wafer, not using a metal lead (wire), when a semiconductor unit called a die is mounted on the wafer, and accordingly, the flip chip is called a wireless semiconductor.

Like this, as the wafer becomes thinner and the number of input/output (I/O) terminals becomes increased, electronic devices have high performance and low power and become lighter, thinner, shorter, and smaller, and recently, wafer level chip scale package (WLCSP) technologies in which the solder balls as bump balls are directly attached to the wafer to make semiconductor packages have been developed. Like this, a system for attaching the solder balls to the wafer is called a solder ball placement system.

Up to now, however, most of conventional technologies related to the solder ball placement system have developed some of components and functions of the system operating in a specific method, like the prior art literatures as will be mentioned below.

Contrarily, semiconductor fields have been developed drastically from memory-centered manufacturing in which specific products are produced in mass to non-memory technology fields in which small quantity batch production is made, particularly foundry technology fields, and accordingly, the solder ball placement system has to be developed in accordance with such a change of the semiconductor fields.

(Patent Literature 1) Korean Patent No. 10-1364043 entitled 'Flux tool and ball tool of solder ball mounting equipment'

(Patent Literature 2) Korean Patent No. 10-1738511 entitled 'Solder ball mounting equipment having extra ball removing and scattering preventing function'

DISCLOSURE

Technical Problem

Accordingly, the present invention has been made in view of the above-mentioned problems occurring in the related art, and it is an object of the present invention to provide a method for controlling a boat carrier/substrate strip type solder ball placement system that is capable of allowing solder ball mounting processes for a boat carrier type of a material and a substrate strip type of a material to be all performed in one system.

It is another object of the present invention to provide a method for controlling a boat carrier/substrate strip type solder ball placement system that is capable of allowing components or operation setting of the system to be automatically controlled according to the types of materials loaded on a magazine, thereby performing solder ball mounting processes for the two types of materials with high speed and high accuracy.

It is yet another object of the present invention to provide a method for controlling a boat carrier/substrate strip type solder ball placement system that is capable of allowing a component applied only to a solder ball mounting process for a boat carrier type of a material and a component applied to a solder ball mounting process for a substrate strip type of a material to be integrated with each other as a single component in a process of mounting solder balls on the material on-loaded, thereby making it possible to perform the solder ball mounting processes for the two different types of materials in one system.

Technical Solution

To accomplish the above-mentioned objects, according to the present invention, there is provided a method for controlling a boat carrier/substrate strip type solder ball placement system for mounting solder balls on any one of materials made as a boat carrier type of a material and a substrate strip type of a material and supplied thereto, the method including: a material manufacturing type checking step of checking a magazine loaded thereon to recognize the manufacturing types of the materials stacking on the magazine; an operation setting control step of controlling at least one of operation setting information and internal components of the solder ball placement system according to the material manufacturing types; and a solder ball mounting step of mounting the solder balls on the corresponding material based on the operating setting information.

Further, the operation setting control step may be performed by controlling, according to the material manufacturing types, at least one of distance control and operation setting of a gripper for picking up the corresponding material, selection and exchanging of a flux tool and a ball tool for mounting the solder balls, and a pre-alignment operation.

Moreover, the gripper for gripping the material may have a pre-alignment tool disposed on one side thereof to align the boat carrier type material, and the solder ball mounting step may include the steps of: if the material is the boat carrier type material, gripping the corresponding material by the gripper; transferring the gripped material by the gripper to a transferring unit; and aligning units of the material transferred to the transferring unit by means of the pre-alignment tool, whereas if the material is the substrate strip type material, gripping the corresponding material by the gripper; transferring the gripper to a position close to the transferring unit; and transferring the gripped material by the gripper to the transferring unit and pushing and sucking the material placed on the transferring unit by means of the pre-alignment tool.

Advantageous Effects

According to the present invention, the method for controlling the boat carrier/substrate strip type solder ball placement system is configured to allow the solder ball mounting processes for the boat carrier type of material and the substrate strip type of material to be all performed in one system.

Accordingly, the present invention advantageously provides the solder ball placement system that is optimized in achieving small quantity batch production.

In specific, the method for controlling the boat carrier/substrate strip type solder ball placement system is configured to allow the components (for example, the flux tool and the ball tool) or operation setting of the system to be automatically controlled according to the types of materials loaded on the magazine, thereby performing the solder ball mounting processes for the two types of materials with high speed and high accuracy.

Further, the method for controlling the boat carrier/substrate strip type solder ball placement system is configured to allow the components or operation setting for the next process to be pre-controlled in the process of onloading the magazine on which the materials are loaded, when the control process for the system is performed according to the types of materials, to immediately mount the solder balls on the material on-loaded, thereby minimizing the extension of time caused by the control of the system or component exchanging according to the types of materials and suppressing the productivity reduction caused by the extension of the time.

Moreover, the method for controlling the boat carrier/substrate strip type solder ball placement system is configured to allow the component applied only to the solder ball mounting process for the boat carrier type of material and the component applied to the solder ball mounting process for the substrate strip type of material to be integrated with each other as a single component in the process of mounting the solder balls on the material on-loaded, thereby making it possible to perform the solder ball mounting processes for the two different types of materials in one system.

The present invention is applicable to semiconductor fields, semiconductor package manufacturing fields, PCB manufacturing fields, particularly wafer level chip scale package (WLCSP)-based manufacturing fields, solder ball placement system fields, and other fields similar or related thereto, thereby improving reliability and competitiveness of products.

MODE FOR INVENTION

Hereinafter, exemplary embodiments of a method for controlling a boat carrier/substrate strip type solder ball placement system according to the present invention will be described in detail with reference to the accompanying drawings.

Figure 4:
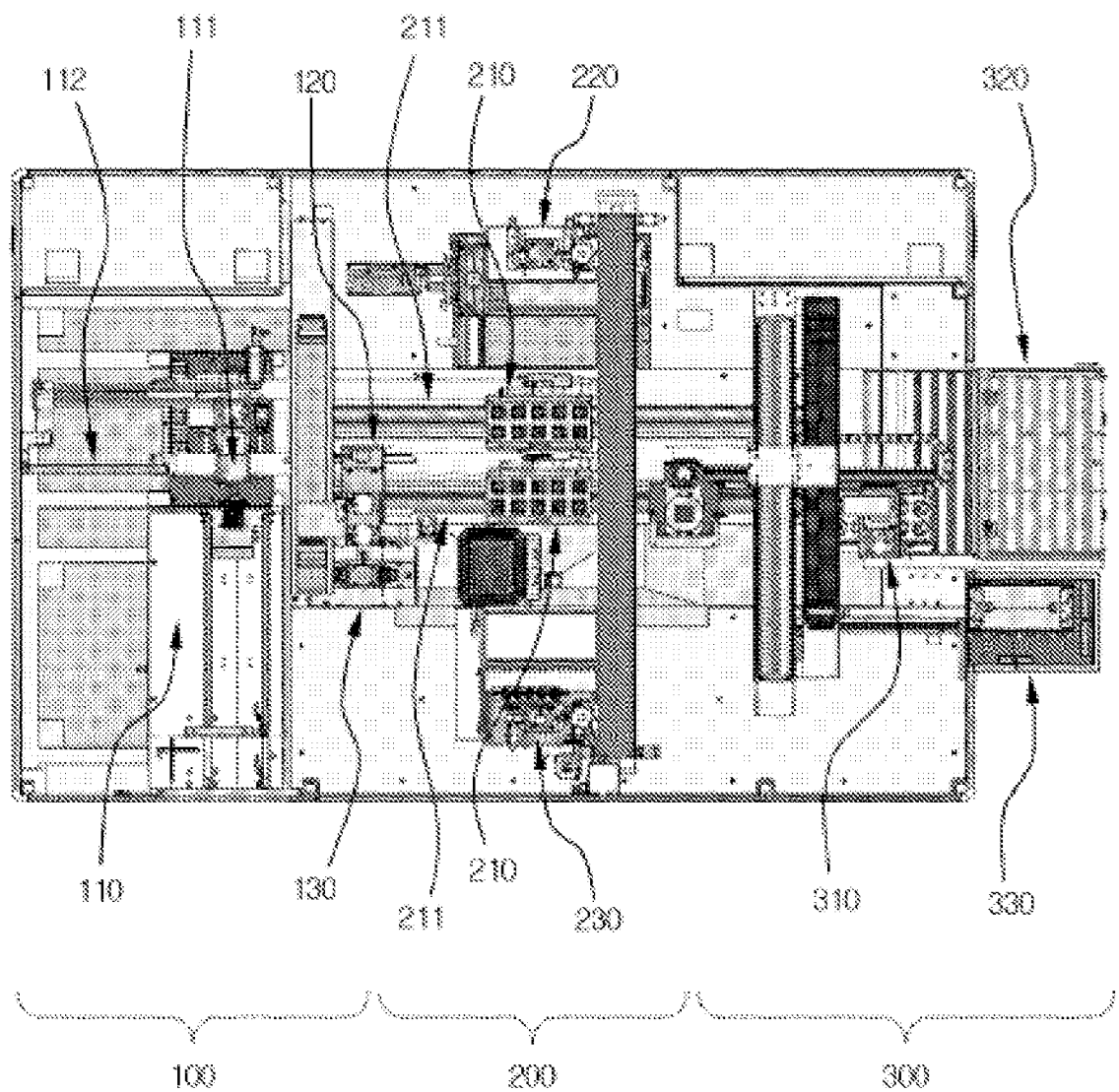
FIG. 4 is an exemplary view showing a configuration of a boat carrier/substrate strip type solder ball placement system according to the present invention.

First, a boat carrier/substrate strip type solder ball placement system according to the present invention will be explained, and as shown in FIG. 4, the boat carrier/substrate strip type solder ball placement system includes an input zone 100, a working zone 200, and an output zone 300.

The input zone 100 serves to perform onloading for the materials made in a pre-process and prepare for mounting solder balls on the materials and includes an onloading unit 110, a gripper 120, and a pre-alignment tool 130.

The onloading unit 110 receives a magazine on which the materials are loaded from the outside, the gripper 120 picks up the materials loaded on the magazine sequentially, and the pre-alignment tool 130 aligns units located on the boat carrier type material.

In this case, the gripper 120 and the pre-alignment tool 130 handle both of the boat carrier type of material and the substrate strip type of material so as to achieve the objects of the present invention, which will be explained in detail later.

Further, the input zone 100 includes a pusher 111 for individually supplying the materials loaded on the magazine and an onloading elevator 112 for elevating step by step the magazine to supply the materials multi-stacking on the magazine sequentially.

The working zone 200 serves to mount the solder balls on the material supplied from the input zone 100 and includes a transferring unit 210, a flux tool 220, and a ball tool 230.

The transferring unit 210 serves to place the material picked up by the gripper 120, the flux tool 220 applies flux to the material placed on the transferring unit 210, and the ball tool 230 attaches the solder balls to the flux applied to the material.

So as to perform the application of the flux or the attachment of the solder balls, in this case, the working zone 200 further includes a flux box and a flux cleaner connected to the flux tool 220 and a ball box and a ball supply module connected to the ball tool 230, and of course, other components related thereto may be added or changed according to the request of a person having the skill in the art.

Further, the working zone 200 includes a feeding rail 211 for moving the transferring unit 210, and to improve rapidness in work, as shown in FIG. 4, the transferring unit 210 and the feeding rail 211 are provided in a dual type form.

The output zone 300 serves to inspect the material to which the solder balls are attached to dividedly discharge a normal product and a defective product and includes an offload gripper 310 for picking up the material to which the solder balls are attached from the transferring unit 210, an offload conveyor 320 for sending the material to which the solder balls are attached to a next process, and a reject elevator 330 for sorting the defective product.

In addition thereto, the output zone 300 includes vision sensors for determining whether the respective processes are normally performed and general components requested by a person having the skill in the art.

Hereinafter, a method for controlling the boat carrier/substrate strip type solder ball placement system as shown in FIG. 4 according to the present invention will be explained.

Figure 1:
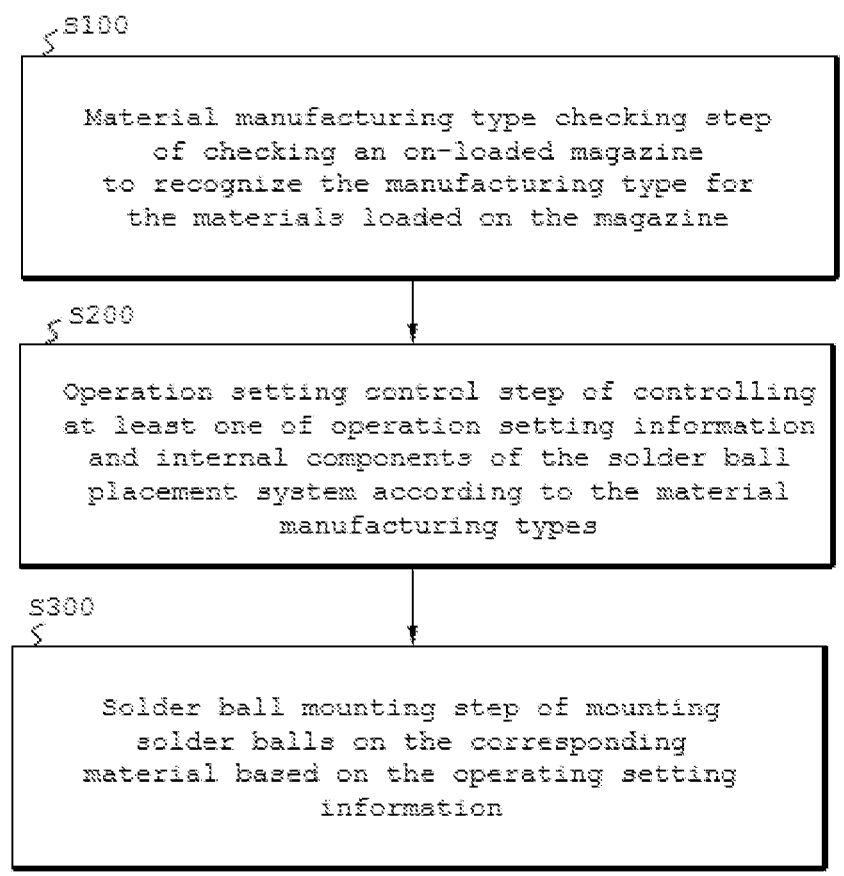
FIG. 1 is a flowchart showing a method for controlling a boat carrier/substrate strip type solder ball placement system according to the present invention.
Figure 2:
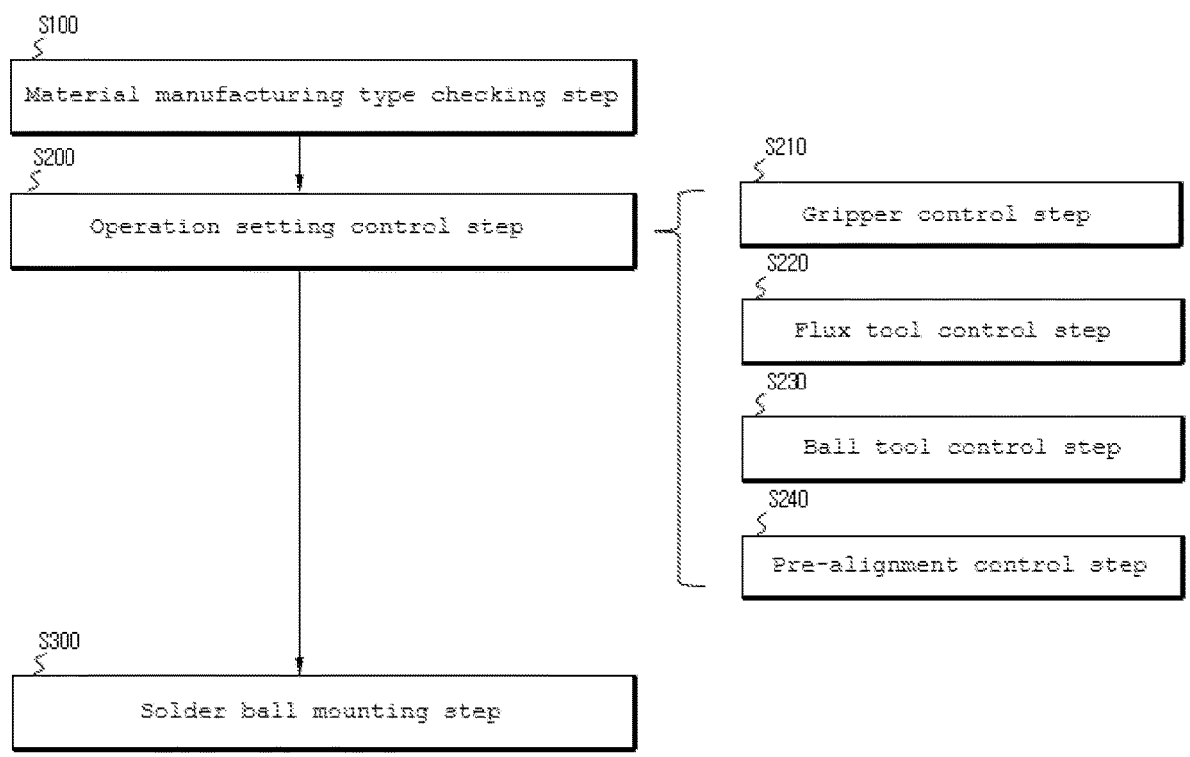
FIG. 2 is a flowchart showing specific steps in step S200 of FIG. 1.

FIG. 1 is a flowchart showing a method for controlling the boat carrier/substrate strip type solder ball placement system according to the present invention, and FIG. 2 is a flowchart showing specific steps in step S200 of FIG. 1. The steps as will be discussed below are controlled by a control module or control terminal of the system.

Referring to FIG. 1, a method for controlling the boat carrier/substrate strip type solder ball placement system according to the present invention includes a material manufacturing type checking step S100, an operation setting control step S200, and a solder ball mounting step S300.

At the material manufacturing type checking step S100, the magazine loaded on the input zone 100 is checked to recognize the manufacturing type for the materials loaded on the magazine.

For example, if the material information on one side of the magazine is printed to the form of barcodes, a barcode reader is provided for the onloading unit 110, and through the barcode reader, it is checked whether the materials loaded on the magazine are boat carrier type materials or substrate strip type materials.

Of course, the types of the materials loaded on the magazine may be checked by means of various methods such as RFID, and the like.

At the operation setting control step S200, at least one of operation setting information and internal components of the solder ball placement system is controlled according to the material manufacturing types, and as shown in FIG. 2, the operation setting control step S200 includes a gripper control step S210, a flux tool control step S220, a ball tool control step S230, and a pre-alignment tool control step S240.

For example, the gripper control step S210 is performed by controlling a distance of the gripper 120 to place the material therein if the boat carrier type material is supplied, and the distance is controlled according to next processes. If the substrate strip type material is supplied, the gripper control step S210 is performed by controlling a distance of the gripper 120 to a width of the material and by then fixing the distance to the width of the material.

The flux tool control step S220 and the ball tool control step S230 are processes in which the flux tool and the ball tool are exchanged according to the corresponding material, and in this case, the tools are detachably attached automatically to tool mounting units to which they are coupled. Accordingly, the tools may be provided according to materials.

If the types of materials supplied are checked, the tool mounting unit detaches the tool currently coupled thereto therefrom, moves to a position where the corresponding tool is placed, and is coupled to the corresponding tool, so that the respective steps are performed.

The pre-alignment tool control step S240 is performed by operating the pre-alignment tool if the material supplied is the boat carrier type material and by controlling the pre-alignment tool from an active state where the boat carrier type material is supplied to a non-active state if the substrate strip type material is supplied.

If such specific control is completed, at the solder ball mounting step S300, the solder balls are mounted on the corresponding material based on the operating setting information controlled.

Figure 3:
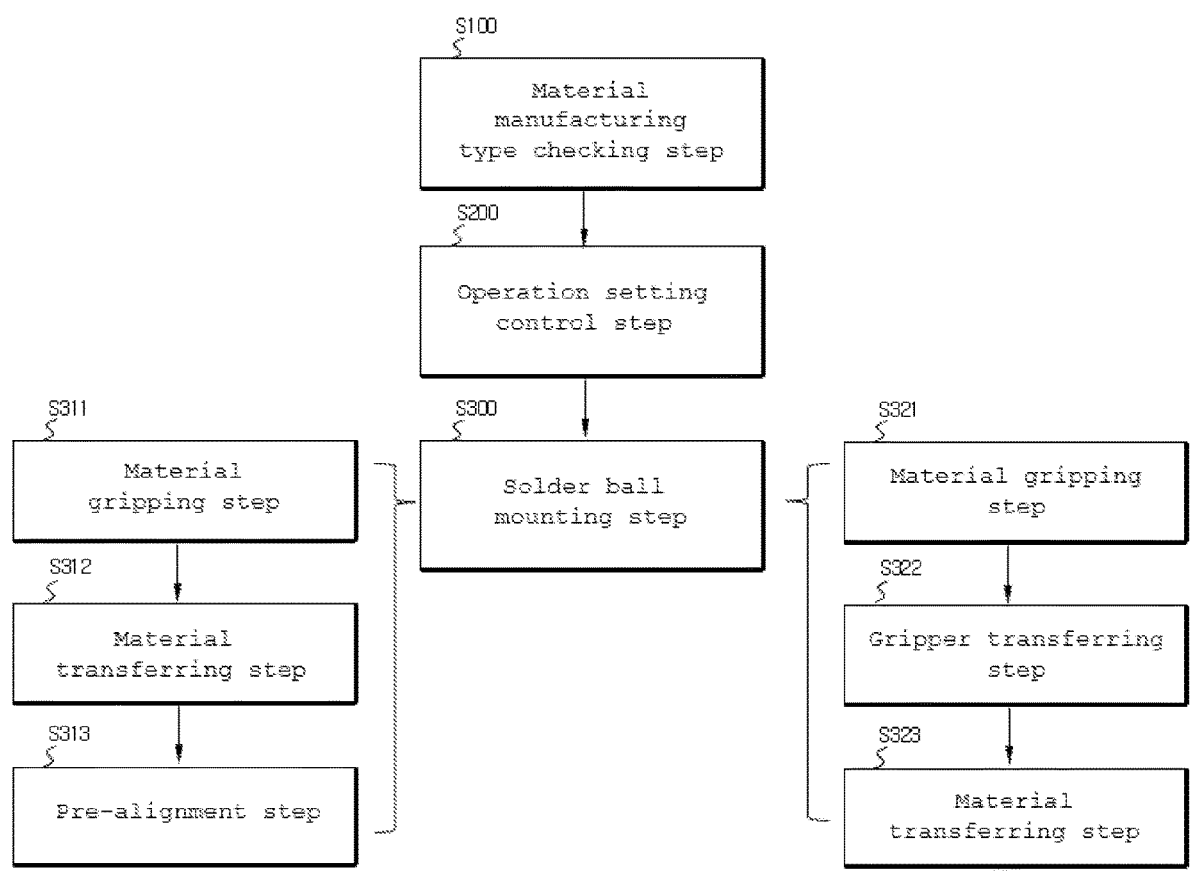
FIG. 3 is a flowchart showing specific steps in step S300 of FIG. 1.

FIG. 3 is a flowchart showing specific steps in step S300 of FIG. 1.

Figure 5:
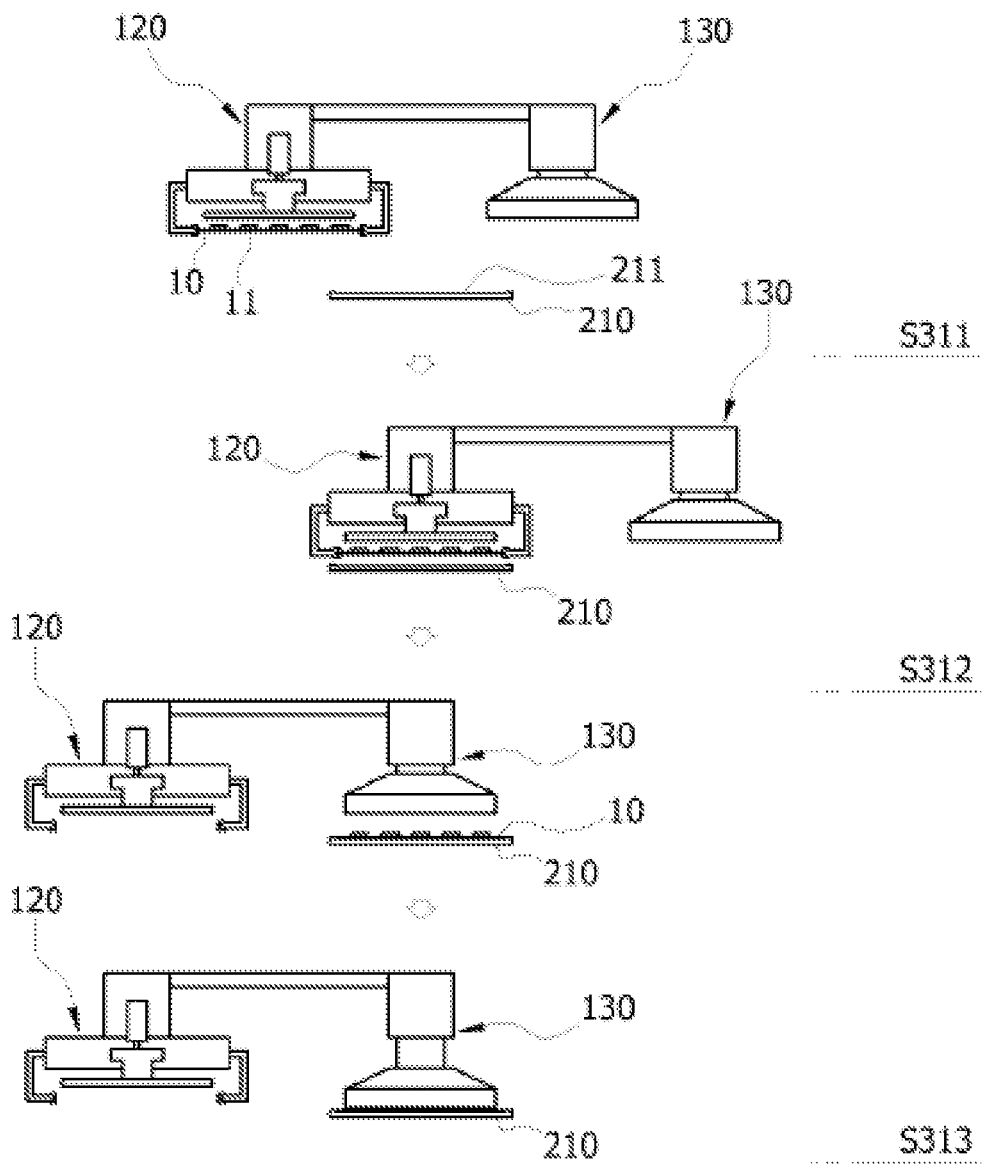
FIG. 5 is a sectional view showing a gripper and a pre-alignment tool of FIG. 4 that operate correspondingly to a boat carrier type of material.
Figure 6:
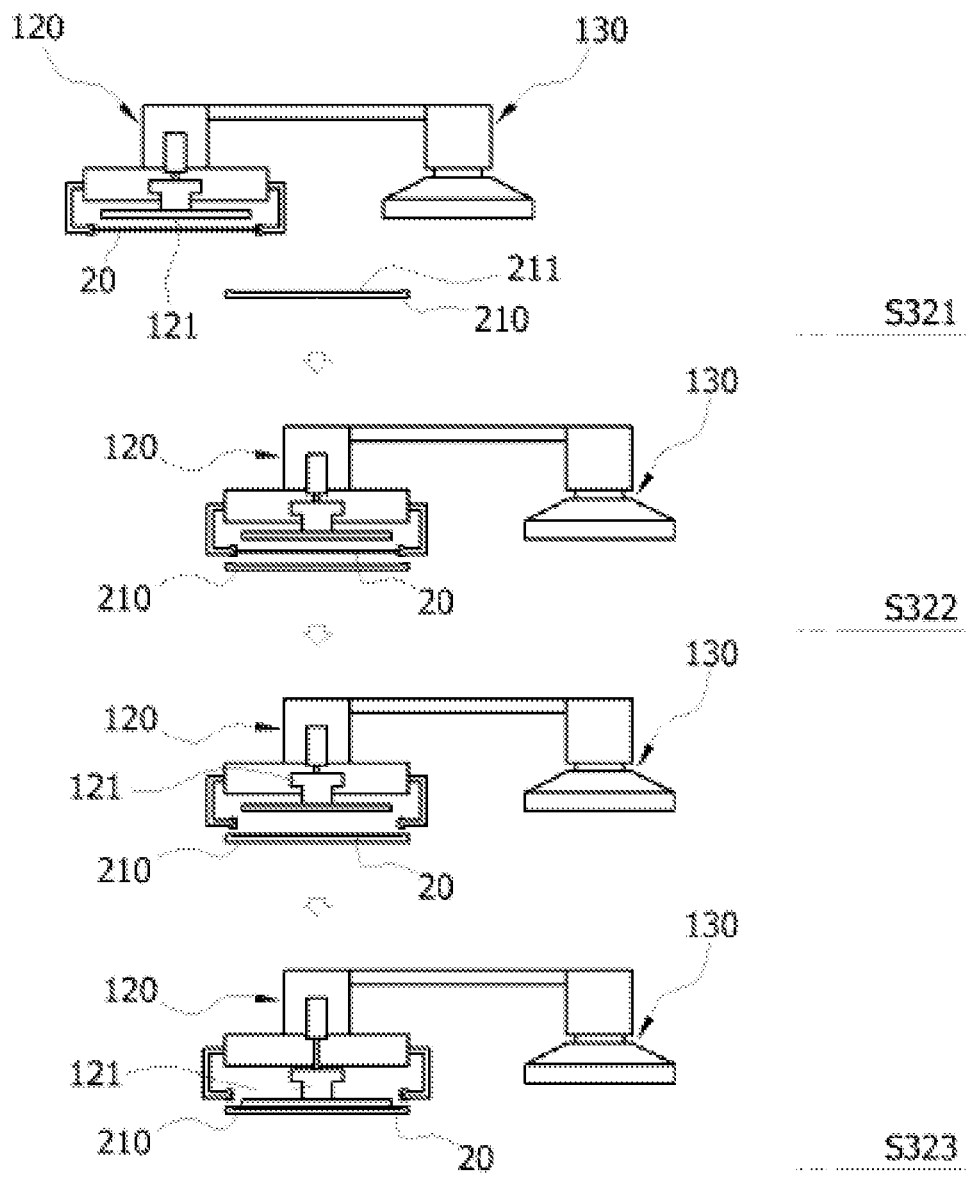
FIG. 6 is a sectional view showing the gripper and the pre-alignment tool of FIG. 4 that operate correspondingly to a substrate strip type of material.

First, as mentioned above, the configuration of the gripper 200 and the pre-alignment tool 130 in which the processes for both of the boat carrier type material and the substrate strip type material are performed so as to achieve the objects of the present invention will be explained. As shown in FIGS. 5 and 6, the gripper 120 and the pre-alignment tool 130 are connected to each other, and further, the gripper 120 has a stripper 121 disposed thereon.

If the material loaded on the input zone 100 is the boat carrier type material, as shown in FIG. 5, the boat carrier type material 10 is gripped by the gripper 120 at step S311, and next, the gripper 120 moves above the transferring unit 210 and transfers (places) the gripped material to the transferring unit 210 (above the transferring unit 210) at step S312.

After that, the pre-alignment tool 130 moves above the transferring unit 210, and units 11 of the material 10 transferred to the transferring unit 210 are aligned by means of the pre-alignment tool 130 at step S313.

The boat carrier type material whose alignment is completed moves to the working zone 200, and next, the solder balls are attached to the boat carrier type material 10.

If the material loaded on the input zone 100 is the substrate strip type material, as shown in FIG. 6, the substrate strip type material 20 is gripped by the gripper 120 at step S321, and if gripped, next, the gripper 120 moves close to the transferring unit 210 at step S322 and transfers the gripped material 20 to the transferring unit 210 at step S323.

In this case, the transferring unit 210 sucks the substrate strip type material 20 by means of vacuum. That is, the transferring unit 210 pushes the material 20 through the stripper 121 and sucks the material 20.

If the substrate strip type material 20 is transferred to the transferring unit 210, it moves to the working zone 200, and next, the solder balls are attached to the substrate strip type material 20.

Further, as the gripper 120 and the pre-alignment tool 130 are spaced apart from each other by a given distance under the configuration as shown in FIGS. 5 and 6, they reciprocate to perform the alignment of the boat carrier type material, but because their moving time is included in the time required for performing the corresponding process, productivity may be decreased by the moving time.

Figure 7:
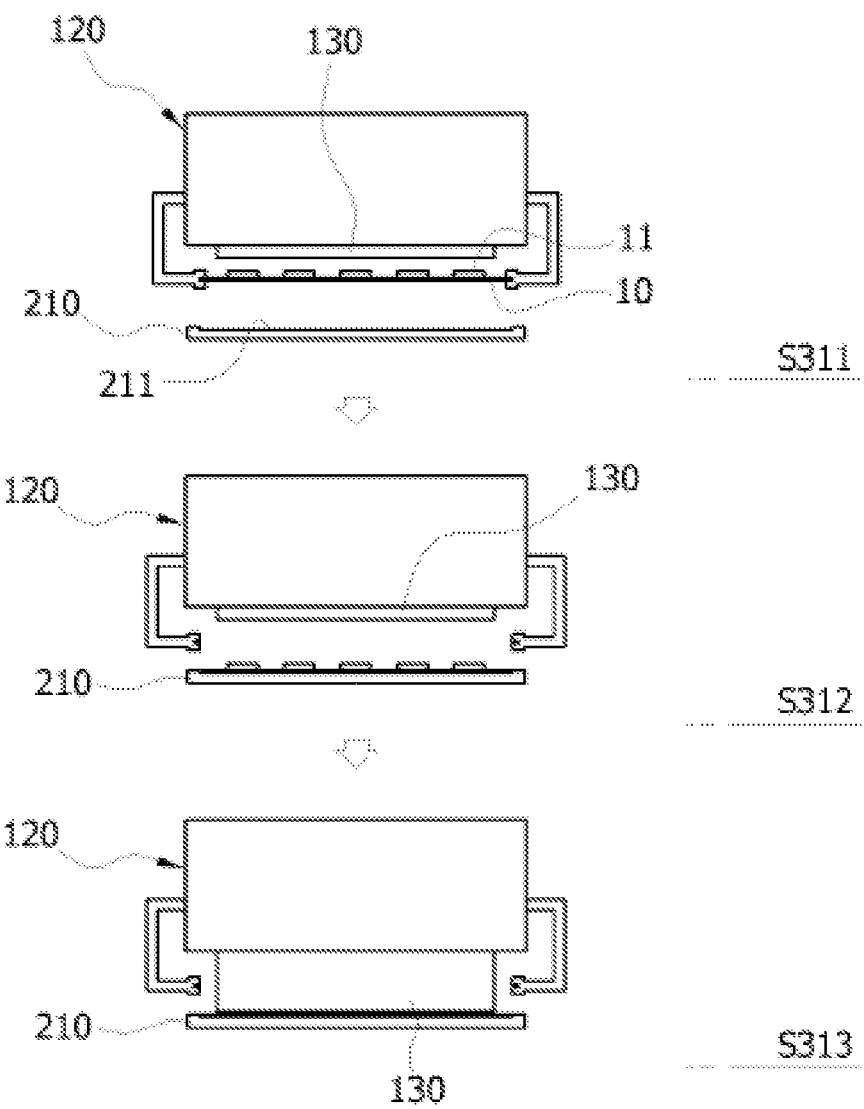
FIG. 7 is a sectional view showing an integrated component between the gripper and the pre-alignment tool of FIG. 4 that operates correspondingly to the boat carrier type of material.

To minimize such time loss, as shown in FIG. 7, the pre-alignment tool 130 is disposed on one side (the lower portion) of the gripper 120.

Under the above-mentioned configuration, the steps of FIG. 3 are explained below.

If the material is the boat carrier type material, as shown in FIG. 7, the boat carrier type material 10 is gripped by the gripper 120 at step S311, and next, the gripper 120 transfers the gripped material 10 to the transferring unit 210 at step S312. After that, the units 11 of the material 10 transferred to the transferring unit 210 are aligned by means of the pre-alignment tool 130 disposed on the lower portion of the gripper 120 at step S313.

Figure 8:
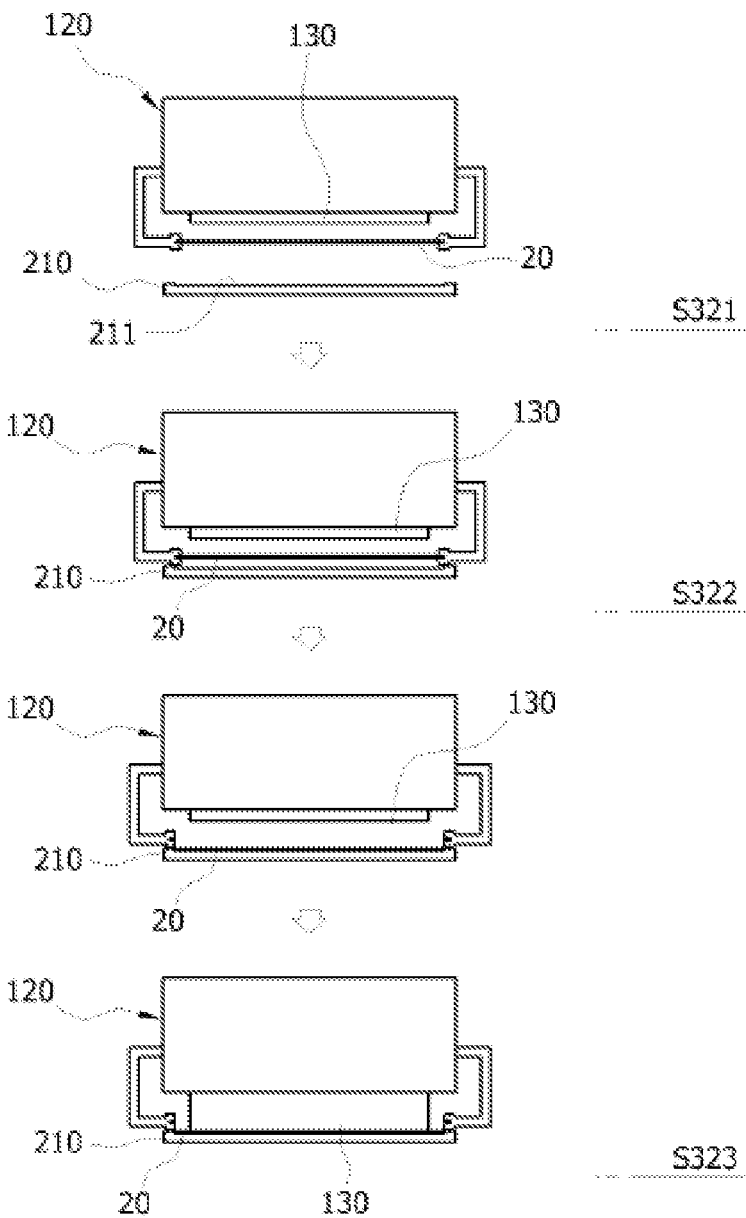
FIG. 8 is a sectional view showing the component of FIG. 7 that operates correspondingly to the substrate strip type of material.

If the material is the substrate strip type material, as shown in FIG. 8, the substrate strip type material 20 is gripped by the gripper 120 at step S321, and next, the gripper 120 moves close to the transferring unit 210 at step S322.

After that, the gripped material 20 is transferred to the transferring unit 210 and the material 20 placed on the transferring unit 210 is pushed and sucked by means of the pre-alignment tool 130 at step S323.

Accordingly, if the gripper 120 and the pre-alignment tool 130 are configured as shown in FIGS. 7 and 8, the corresponding process is performed, while the moving distance is minimized, thereby reducing the time loss and improving the productivity.

While the method for controlling the boat carrier/substrate strip type solder ball placement system according to the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

The foregoing description of the embodiments of the invention has been presented for the purpose of illustration; it is not intended to be exhaustive or to limit the invention to the precise forms disclosed.

100: Input zone
110: Onloading unit
111: Pusher
112: Onload elevator
120: Gripper
130: Pre-alignment tool
200: Working zone
210: Transferring unit
211: Feeding rail
220: Flux tool
230: Ball tool
300: Output zone
310: Offload gripper
320: Offload conveyor
330: Reject elevator

INDUSTRIAL APPLICABILITY

The present invention is applicable to semiconductor fields, semiconductor package manufacturing fields, PCB manufacturing fields, particularly wafer level chip scale package (WLCSP)-based manufacturing fields, solder ball placement system fields, and other fields similar or related thereto, thereby improving reliability and competitiveness of products.

The invention claimed is:

1. A method for controlling a solder ball placement system capable of mounting solder balls on any one of a boat carrier type material and a substrate strip type material, the method comprising:

checking a magazine loaded thereon to determine whether a manufacturing method of a material loaded on the magazine is a boat carrier method or a substrate strip method;

controlling at least one of operation setting information and internal components of the solder ball placement system according to the manufacturing method of the material; and mounting the solder balls on the material based on the operation setting information, wherein the controlling of the at least one of the operation setting information and the internal components includes setting a pre-alignment tool to be in an active state when the material is manufactured by the boat carrier method and in an inactive state when the material is manufactured by the substrate strip method, wherein, when the manufacturing method is the boat carrier method, the mounting of the solder balls includes:

gripping the material by a gripper configured to pick up the material;

transferring the material by the gripper to a transferring unit; and aligning units of the material transferred to the transferring unit by the pre-alignment tool, wherein, when the manufacturing method is the substrate strip method, the mounting of the solder balls includes:

gripping the material by the gripper;

moving the gripper to a position suitable for transfer to the transferring unit;

transferring the material by the gripper to the transferring unit; and pushing the material by the gripper and vacuum-sucking, by the transferring unit, the material placed on the transferring unit.

2. The method according to claim 1, wherein the controlling of the at least one of the operation setting information and the internal components further includes controlling, according to the manufacturing method of the material, at least one of:

distance control of the gripper;

operation setting of the gripper; and selection of and exchanging between a flux tool and a ball tool configured to mount the solder balls.

3. The method according to claim 1, wherein the pre-alignment tool is disposed on one side of the gripper to align the material manufactured by the boat carrier method.

* * * * *